(12) United States Patent
Davies-Venn et al.

(10) Patent No.: US 7,626,472 B2
(45) Date of Patent: Dec. 1, 2009

(54) PACKAGE EMBEDDED THREE DIMENSIONAL BALUN

(75) Inventors: Emile Davies-Venn, Chandler, AZ (US); Telesphor Kamgaing, Chandler, AZ (US)

(73) Assignee: Intel Corporation, Santa Clara, CA (US)

( * ) Notice: Subject to any disclaimer, the term of this patent is extended or adjusted under 35 U.S.C. 154(b) by 238 days.

(21) Appl. No.: 11/729,558

(22) Filed: Mar. 29, 2007

(65) Prior Publication Data

US 2008/0238568 A1    Oct. 2, 2008

(51) Int. Cl.
*H03H 7/42* (2006.01)
*H03H 7/00* (2006.01)

(52) U.S. Cl. ......................... 333/26; 333/185

(58) Field of Classification Search ............ 333/25, 333/26, 185

See application file for complete search history.

(56) References Cited

U.S. PATENT DOCUMENTS

| | | | | |
|---|---|---|---|---|
| 6,603,383 | B2* | 8/2003 | Gevorgian et al. | 336/200 |
| 6,819,200 | B2* | 11/2004 | Zhao et al. | 333/26 |
| 7,068,124 | B2* | 6/2006 | White et al. | 333/185 |
| 7,176,776 | B1* | 2/2007 | Tantwai et al. | 336/200 |
| 7,256,663 | B2* | 8/2007 | Yasuda et al. | 333/26 |
| 2008/0122074 | A1* | 5/2008 | Wong et al. | 257/724 |

* cited by examiner

*Primary Examiner*—Dean O Takaoka
(74) *Attorney, Agent, or Firm*—Caven & Aghevli LLC

(57) ABSTRACT

Methods and apparatus relating to package embedded three dimensional baluns are described. In one embodiment, components of one or more baluns may be embedded in a single semiconductor substrate. Other embodiments are also described.

14 Claims, 4 Drawing Sheets

PACKAGE EMBEDDED THREE DIMENSIONAL BALUN

BACKGROUND

The present disclosure generally relates to the field of electronics. More particularly, an embodiment of the invention relates to package embedded three dimensional baluns.

A balun is a device designed to convert between balanced and unbalanced electrical signals. In some implementations, baluns may be implemented as transmission line transformers. Some radio frequency (RF) front-end modules may use several baluns to convert balanced or differential signals into unbalanced signals and vice-versa. The evolvement of radio architecture (e.g., multiple input, multiple output (MIMO) and multi-band radios) for wireless communication systems makes it challenging to meet the ever shrinking form factor with existing balun topologies. This issue is especially pronounced for System in Package (SiP) integration.

BRIEF DESCRIPTION OF THE DRAWINGS

The detailed description is provided with reference to the accompanying figures. In the figures, the left-most digit(s) of a reference number identifies the figure in which the reference number first appears. The use of the same reference numbers in different figures indicates similar or identical items.

DETAILED DESCRIPTION

In the following description, numerous specific details are set forth in order to provide a thorough understanding of various embodiments. However, various embodiments of the invention may be practiced without the specific details. In other instances, well-known methods, procedures, components, and circuits have not been described in detail so as not to obscure the particular embodiments of the invention. Further, various aspects of embodiments of the invention may be performed using various means, such as integrated semiconductor circuits ("hardware"), computer-readable instructions organized into one or more programs ("software"), or some combination of hardware and software. For the purposes of this disclosure reference to "logic" shall mean either hardware, software, or some combination thereof.

Reference in the specification to "one embodiment" or "an embodiment" means that a particular feature, structure, or characteristic described in connection with the embodiment may be included in at least an implementation. The appearances of the phrase "in one embodiment" in various places in the specification may or may not be all referring to the same embodiment.

Also, in the description and claims, the terms "coupled" and "connected," along with their derivatives, may be used. In some embodiments of the invention, "connected" may be used to indicate that two or more elements are in direct physical or electrical contact with each other. "Coupled" may mean that two or more elements are in direct physical or electrical contact. However, "coupled" may also mean that two or more elements may not be in direct contact with each other, but may still cooperate or interact with each other.

Some embodiments of the invention (such as those discussed with reference to FIGS. 1-7) relate to package embedded three dimensional baluns. In an embodiment, a balun may be integrated in a multilayer package substrate such as organic or low-temperature-cofired ceramic (LTCC), e.g., using a symmetric interwound transformer and embedded capacitors.

Figure 1:
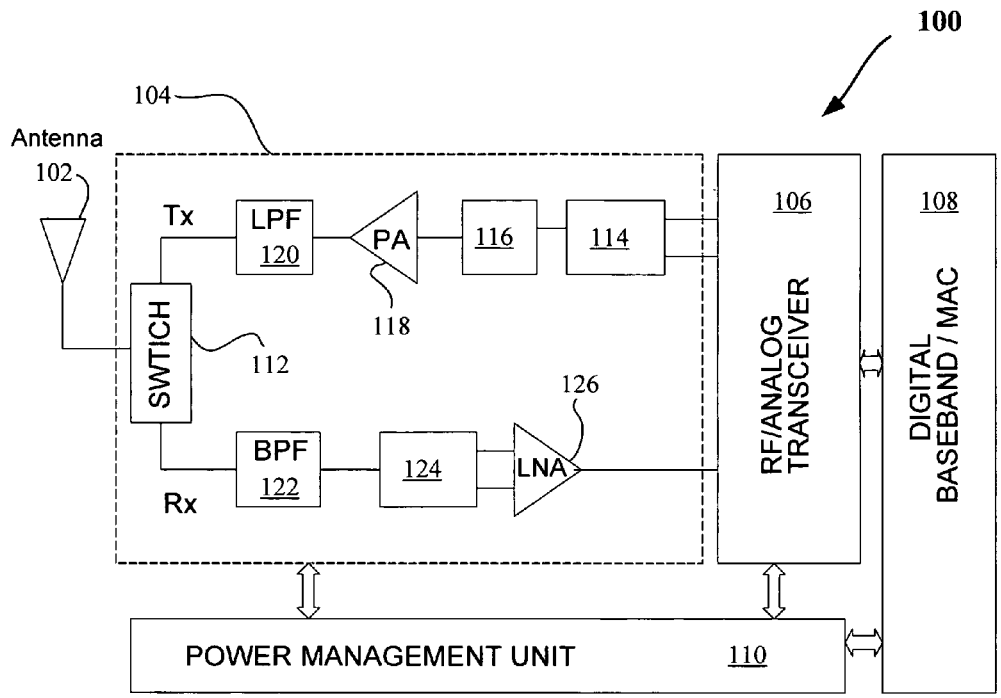
FIG. 1 illustrates a block diagram of a wireless module, according to an embodiment of the invention.

FIG. 1 illustrates a block diagram of a wireless module 100, according to an embodiment of the invention. The module 100 may include an antenna 102 (although more than one antenna may be included in some embodiments), and an RF front end module 104, a transceiver 106, a baseband logic 108 (which may include one or more processors and/or a media access controller (MAC) in some embodiments), and a power management unit 110. The RF front end module 104 may include a switch 112 coupled to the antenna 102 and transmit/receive circuitry. On the transmit side, signals originating from the transceiver 106 may be passed through a balun 114, a band-pass filter (BPF) 116, a power amplifier (PA) 118, and a low-pass filter (LPF) 120. The balun 114 may be used on the transmit side to convert differential signals from the transceiver 106 into single-ended signal before passing the single-ended signal to the rest of the circuitry. On the receive side, signals originating from the switch 112 may be passed through a BPF 122, a balun 124, and a low-noise amplifier (LNA) 126. On the receive side, the balun 124 may be used to convert single-ended signal into differential signal as shown in FIG. 1. Additionally, in some embodiments, the switch 112, PA 118, LNA 126, transceiver 106, baseband logic 108, and/or power management unit 110 may have active circuits, whereas the remaining components of the module 100 may be made of passive circuits only. Generally, active circuits may include single or combination of devices such as diodes and/or transistors that require power supply to operate, whereas passive circuits may include single or combination of devices such as inductors, capacitors, resistors and general substrate interconnects that do not require any power supply to operate. In some embodiments, the LPF 120 may be replaced with a BPF.

Figure 2:
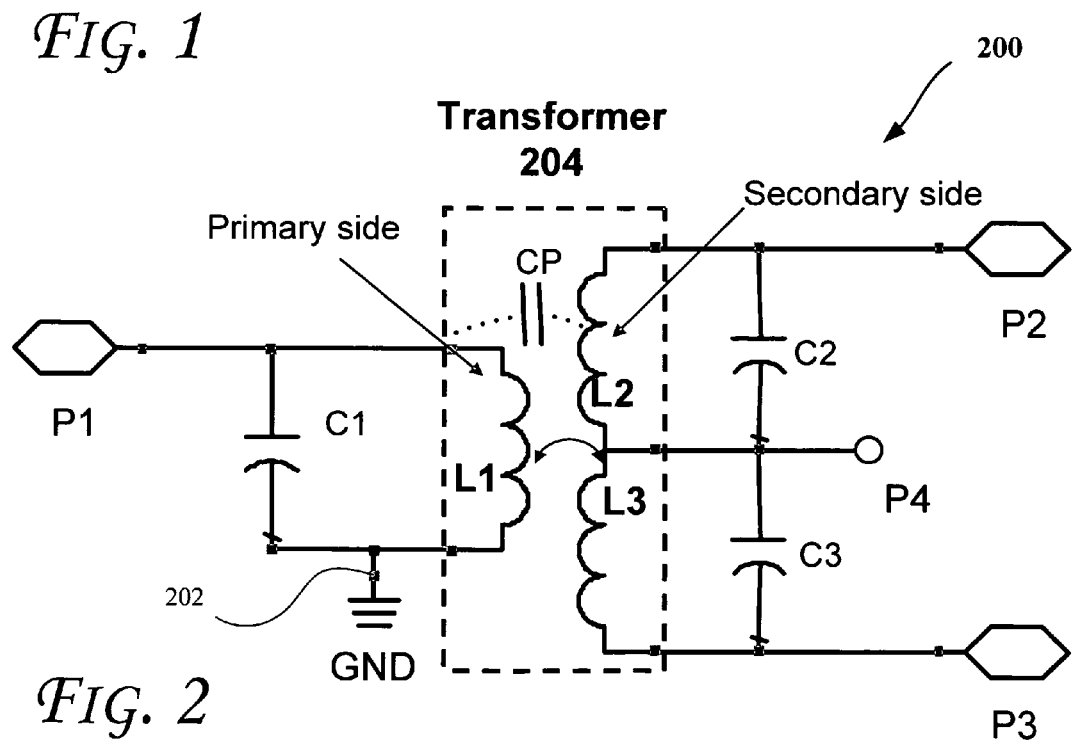
FIG. 2 illustrates a circuit diagram of a balun, according to one embodiment of the invention.

FIG. 2 illustrates a circuit diagram of a balun 200, according to one embodiment of the invention. In an embodiment, the balun 116 and/or 124 of FIG. 1, may be implemented by utilizing the balun 200. The balun 200 may include 4 ports and 5 terminals. The ports are P1 (which is the signal port on the unbalanced side) P2-P3 (which are the signal ports on the balanced side), and port 4 (which is the center-tap, also located on the balanced side of the balun). The signal on each of these ports may be generally referred to a fifth terminal (which may be the reference ground 202). The balun 200 may be bi-directional and as such may be used to convert a balanced signal to an unbalanced signal and vice versa.

In an embodiment, a signal originating from the antenna 102 may be a single-ended signal or unbalanced signal and which may be converted into two balanced or differential signals (as discussed with reference to FIG. 1), when it leaves the outputs of the balun 200. For example, the unbalanced signal reaches the input of the balun 200 at port P1 as a single-ended signal. Generally, at most frequencies, there is relatively a very low-impedance path between port P1 and the reference ground of the circuit 202, e.g., the low-impedance path may be provided by the inductor L1 of the primary side of the transformer 204 at low frequencies and the shunt capacitor C1 at high frequencies. At the frequency range of interest (e.g., select frequency of operation for the balun 200), the resonance of primary side inductor L1 and capacitor C1 may provide a high impedance path between port P1 and ground 202. Signal arriving at port P1 at that specific frequency may be transmitted through electromagnetic coupling of transformer 204 to the secondary side inductors L2 and L3. At this same frequency, two resonant circuits with high path impedance to ground 202 may be present at port P2 and port P3, indicating that the signal arriving from the primary side of the balun 200 is directed towards the circuit block following the balanced side of the balun 200. These resonant circuits may be defined by half of the secondary side inductors L2 and L3 (with respect to the center tap) and the associated parallel capacitor C2 or C3, respectively.

In an embodiment, to maintain the two output signals at port P2 and port P3 at about 180 degrees phase differentials from each other, the center tap P4 may be coupled to an RF ground, which may be either a coupling to the physical ground of the circuit (e.g., 202) or a coupling to a DC bias point in the same circuit. In an embodiment, the use of symmetric spiral on the secondary side may result in the physical and electrical centers of the secondary side inductor being the same, therefore, reducing both phase and amplitude imbalances in the two output signals. In the latter case, the two output capacitors C2 and C3 may be the same or similar. In case, the physical center and electrical center are not identical, different values may be provided for capacitors C2 and C3 to compensate for the imbalances.

In some embodiments, for the differential mode or balanced to single-ended mode or unbalanced signal conversion, two input signals incident at port P2 and port P3 may be coupled magnetically to the primary side of transformer 204 and recombined to form a single-end signal that is passed to the antenna 102 of FIG. 1, for example. In some implementations, the balun 200 may have some inherent parasitic capacitance (labeled as CP in FIG. 2), e.g., between the winding of each inductor as well as across the two inductors.

Figure 3:
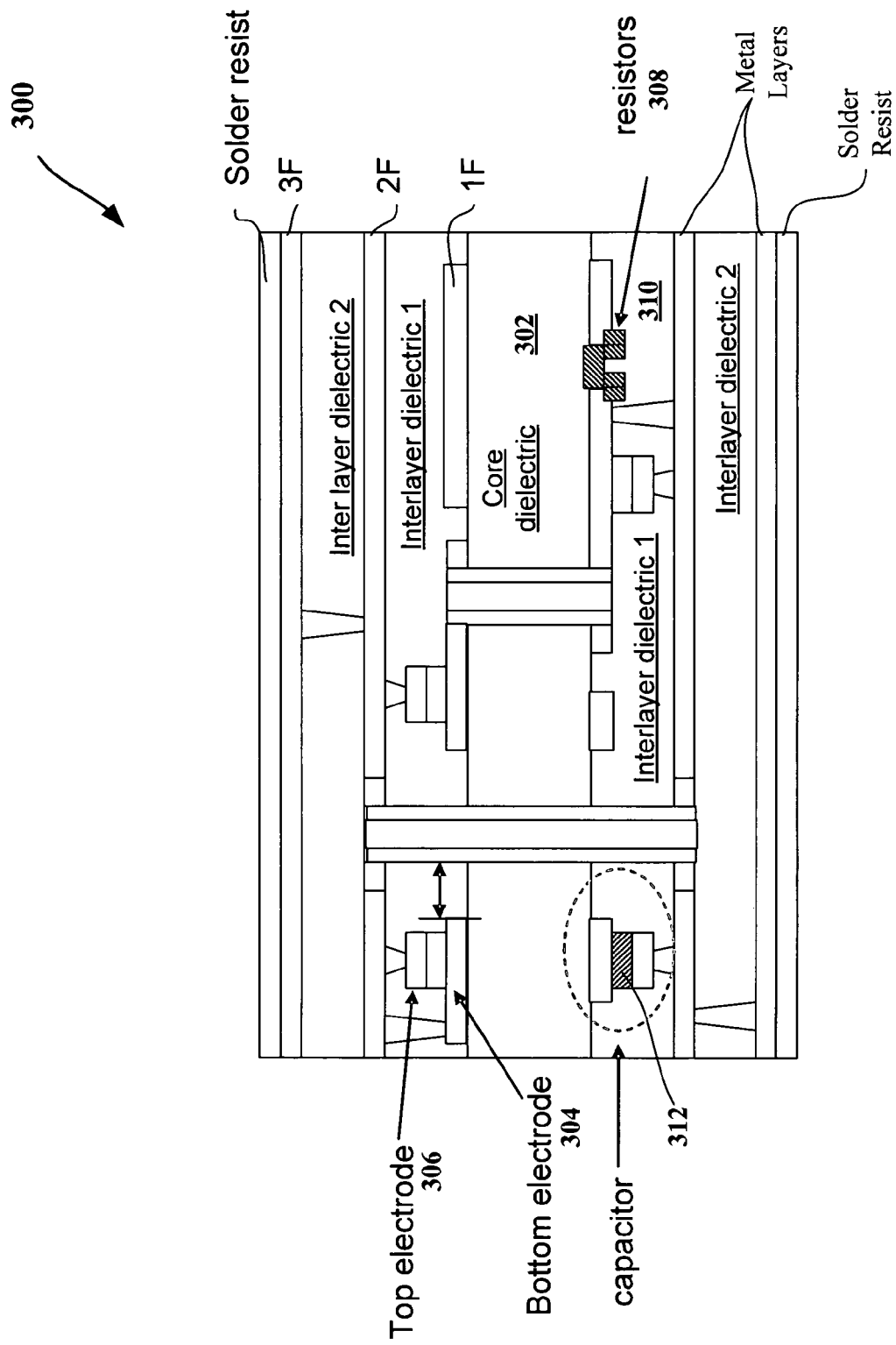
FIG. 3 illustrates a cross-sectional view of a multilayer organic substrate with embedded passive elements, in accordance with an embodiment of the invention.

FIG. 3 illustrates a cross-sectional view of a multilayer organic substrate 300 with embedded passive elements, in accordance with an embodiment of the invention. For the balun implementation, the substrate 300 may use 2 metal layers (1F and 2F for example) in an embodiment. Metal layer 2F may be etched to form the spiral inductors used in the balun (e.g., baluns discussed with reference to FIGS. 1-2). The top most metal layer 3F may be optionally used in some embodiments. The symmetric nature of the substrate (e.g., top portion of the substrate 300 compared to its bottom portion) may allow for having baluns on either side of the core dielectric 302. For example, vertical integration may be used to reduce the form factor and component density in comparison to surface mount discrete baluns. For capacitors, the electrode closest to the core 302 may be called the bottom electrode 304, whereas the other electrode may be called the top electrode 306. The capacitance value may be defined by the top electrode dimensions, the thickness and the dielectric constant of the capacitor material 312 sandwiched between the two electrodes 304 and 306. The capacitor material 312 may be etched to have the same lateral dimensions as the capacitor top electrode. In addition, this material 312 may have a dielectric constant several times (e.g., at least six times) larger than that of the build-up dielectric material. The substrate 300 may also include one or more resistors 308 coupled between the core 302 and an interlayer dielectric 310. As shown in FIG. 3, the substrate 300 may include more metal layers on the bottom side and a solder resist layer also.

Figure 4:
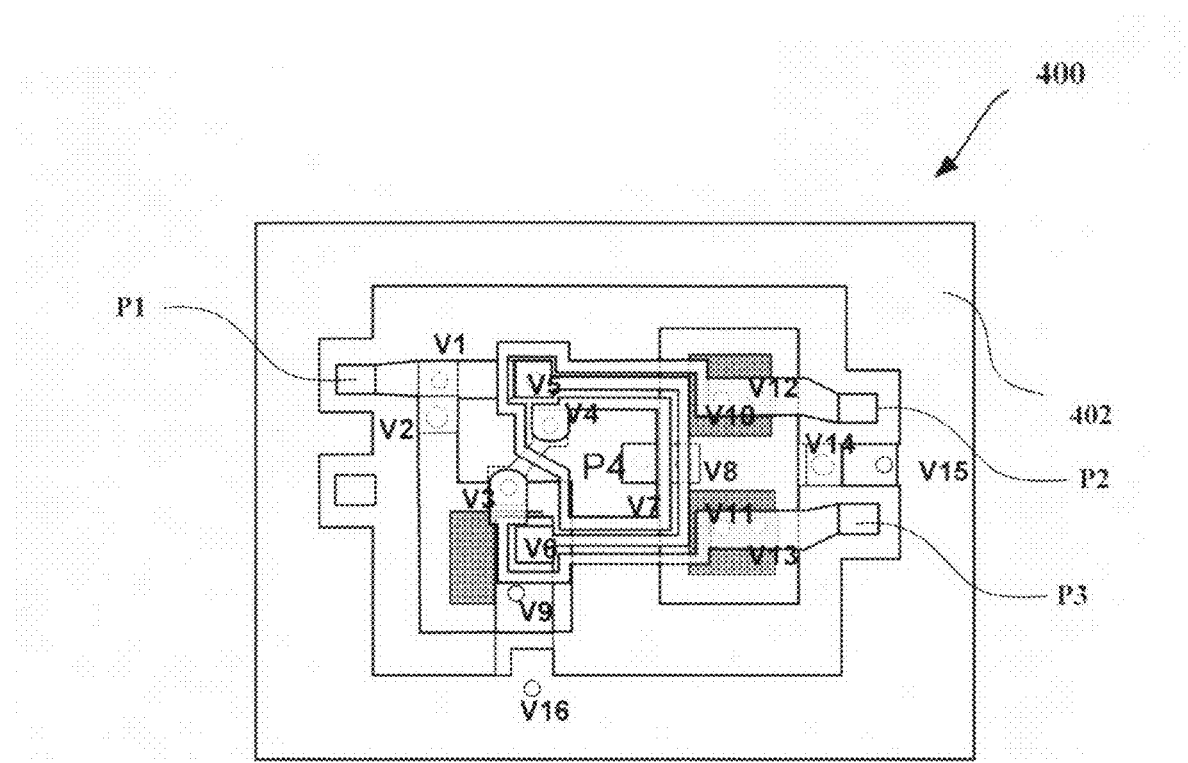
FIGS. 4 and 5 illustrate top and perspective views of embedded baluns, respectively, in accordance with some embodiments of the invention.
Figure 5:
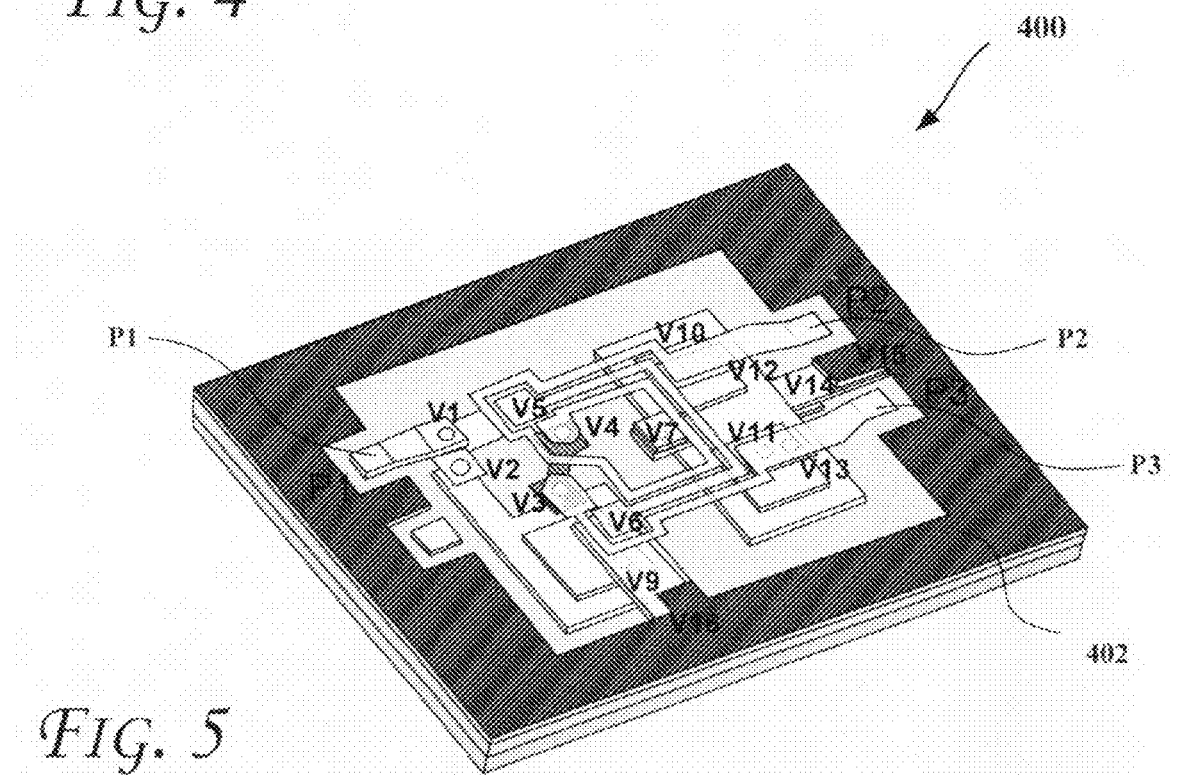

FIGS. 4 and 5 illustrate top and perspective views of embedded baluns 400 and 500, respectively, in accordance with some embodiments of the invention. Table 1 below indicates various via descriptions for FIGS. 4-7. Any of these vias may be replaced with an array of multiple vias connected in parallel between the two designated metal layers as specified in the location column of Table 1.

TABLE 1

Via Description

| Via Name | Location | Description |
| --- | --- | --- |
| V1 (Via 1) | Metal 2 to Metal 3 | Couples underpass from one end of primary coil through V5 to P1 |
| V2 (Via 2) | Metal 1 to Metal 2 | Couples V1 to bottom plate of capacitor at P1 |
| V3 (Via 3) | Metal 2 to Metal 3 | Couples one end of outermost turn of secondary coil to underpass |
| V4 (Via 4) | Metal 2 to Metal 3 | Couples one end of innermost turn of secondary coil to underpass |
| V5 (Via 5) | Metal 2 to Metal 3 | Couples one end of primary coil through an underpass to V1 |
| V6 (Via 6) | Metal 2 to Metal 3 | Couples other end of primary coil to an underpass going to ground ring |
| V7 (Via 7) | Metal 2 to Metal 3 | Couples center-tap of secondary coil to top via plate of V8 |
| V8 (Via 8) | Metal 1 to Metal 2 | Couples center-tap through V8 to bottom plate of capacitors at P2/P3 |
| V9 (Via 9) | Metal 1b to Metal 2 | Couples underpass going to ground ring from V6 to top plate of capacitor at P1 |
| V10 (Via 10) | Metal 2 to Metal 3 | Couples P2 to top via plate of V12 |
| V11 (Via 11) | Metal 2 to Metal 3 | Couples P3 to top via plate of V13 |
| V12 (Via 12) | Metal 1b to Metal 2 | Couples V10 to top plate of capacitor at P2 |
| V13 (Via 13) | Metal 1b to Metal 2 | Couples V11 to top plate of capacitor at P3 |

TABLE 1-continued

Via Description

| Via Name | Location | Description |
| --- | --- | --- |
| V14 (Via 14) | Metal 1 to Metal 2 | Couples bottom plate of capacitors at P2/P3 to ground ring through V15. |
| V15 (Via 15) | Metal 2 to Metal 3 | Couples ground ring to top plate of V14 |
| V16 (Via 16) | Metal 2 to Metal 3 | Couples underpass from V6 to ground ring |

Referring to FIG. 4, a top view of an embedded balun 400, in accordance with an embodiment of the invention. The balun 400 is shown with an optional ground ring 402, e.g., provided on one metal layer which may be used as reference for the entire circuit. As shown in FIG. 4, the balun 400 may include a center tap (e.g., P4) that is coupled to the physical ground in an embodiment. Referring to FIG. 5, a perspective view of the embedded balun 400 is shown.

Figure 6:
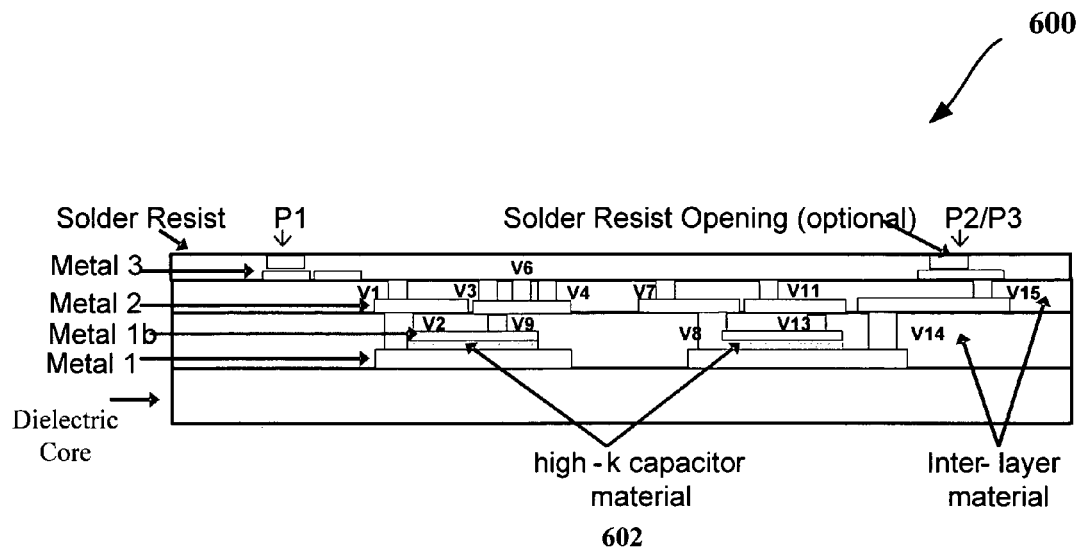
FIGS. 6 and 7 illustrate cross-sectional views of embedded baluns, according to some embodiments of the invention.

FIG. 6 illustrates a cross-sectional view of an embedded balun 600 according to one embodiment of the invention. The balun 600 may include embedded capacitor material 602, e.g., etched to the dimensions of the corresponding top electrodes.

Figure 7:
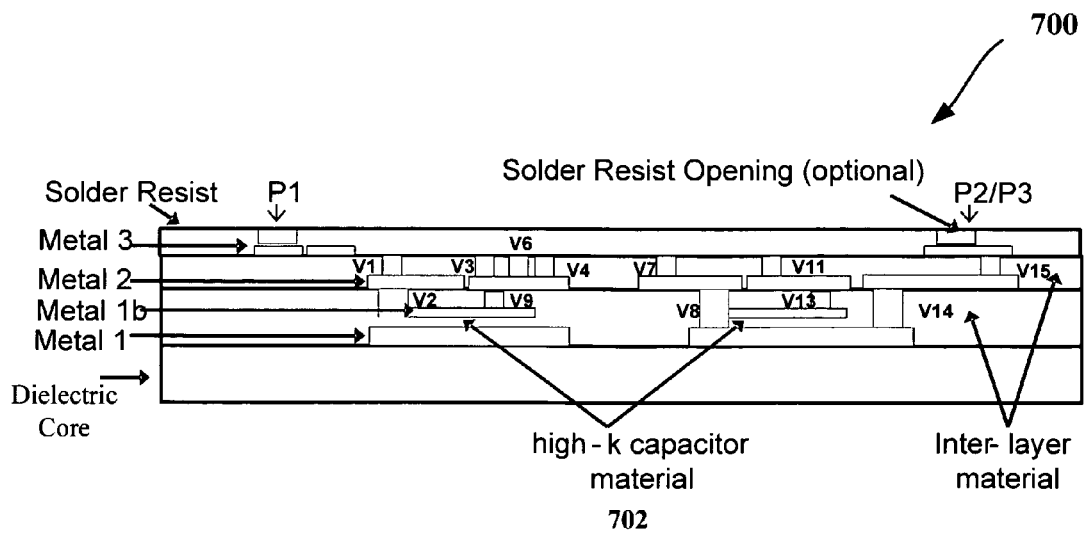

FIG. 7 illustrates a cross-sectional view of an embedded balun 700 according to one embodiment of the invention. The balun 700 may include embedded capacitor layer 702, e.g., which may not be etched such that the capacitor layer 702 may extend over the entire length and width of the balun 700 substrate.

Moreover, some of the embodiments discussed herein may: (a) enable small form-factor for RF SiP modules; (b) provide about three-times form factor reduction in comparison to transmission line Marchand baluns implemented on package for operation in the same frequency band; (c) require no assembly, e.g., because balun is fabricated as part of the embedded passives substrate, which may result in better reliability due to the elimination of solder joint; and/or (d) improve electrical performance and/or reduce costs in comparison with semiconductor based baluns (such as integrated passive device (IPD) baluns); and/or (e) provide low profile package since embedded passive elements do not add to system thickness in comparison to discrete elements.

Moreover, RF FEM may be used in various wireless communication systems which may include notebooks, desktop personal computers (PCs), and/or ultra-mobile PCs. Most portable devices that need wireless data or voice transfer such as personal digital assistants (PDAs) or cellular phones may also take advantage of the embodiments discussed herein, In various embodiments of the invention, the operations discussed herein, e.g., with reference to FIGS. 1-7, may be implemented as hardware (e.g., logic circuitry), software, firmware, or combinations thereof, which may be provided as a computer program product, e.g., including a machine-readable or computer-readable medium having stored thereon instructions (or software procedures) used to program a computer to perform a process discussed herein. The machine-readable medium may include a storage device to store the computer program.

Additionally, such computer-readable media may be downloaded as a computer program product, wherein the program may be transferred from a remote computer (e.g., a server) to a requesting computer (e.g., a client) by way of data signals embodied in a carrier wave or other propagation medium via a communication link (e.g., a bus, a modem, or a network connection). Accordingly, herein, a carrier wave shall be regarded as comprising a machine-readable medium.

Thus, although embodiments of the invention have been described in language specific to structural features and/or methodological acts, it is to be understood that claimed subject matter may not be limited to the specific features or acts described. Rather, the specific features and acts are disclosed as sample forms of implementing the claimed subject matter.

What is claimed is:

1. A substrate comprising:
a first metal layer;
a second metal layer; and
one or more capacitor layers,
wherein the first and second metal layers and the one or more capacitor layers form a balun and wherein the one or more capacitor layers are located between the first metal layer and the second metal layer.

2. The substrate of claim 1, wherein the first metal layer comprises a spiral portion to form a first inductor and sections of a second inductor and the second metal layer comprises a spiral portion to form a second inductor and sections of the first inductor.

3. The substrate of claim 2, wherein the first and second inductors form the transformer portion of the balun.

4. The substrate of claim 1, wherein the capacitor layers are etched to form fully isolated capacitor islands.

5. The substrate of claim 1, wherein the capacitor layers are extended over an entire length and width of the substrate.

6. The substrate of claim 1, further comprising a plurality of dielectric layers coupled to one or more of the first metal layer, the second metal layer, or one or more of the capacitor layers.

7. The apparatus of claim 1, further comprising a symmetric on-package transformer that comprises a first inductor and a second inductor, wherein the first metal layer comprises a spiral portion to form the first inductor and sections of the second inductor and the second metal layer comprises a spiral portion to form a second inductor and sections of the first inductor.

8. The substrate of claim 1, further comprising a third metal layer that is electrically coupled to the first metal layer and a fourth metal layer that is electrically coupled to the second metal layer.

9. The substrate of claim 8, further comprising one or more solder resist layers coupled to the top and bottom most metal layers.

10. A method comprising:
providing a first metal layer;
providing a second metal layer; and
providing a capacitor layer, wherein the first and second metal layers and the capacitor layer form a balun and wherein the one or more capacitor layers are located between the first metal layer and the second metal layer.

11. The method of claim 10, further comprising coupling portions of the first metal layer through one or more vias to form a first spiral portion and coupling portions of the second metal layer through one or more vias to form a second spiral portion.

12. The method of claim 10, further comprising etching the capacitor layer.

13. The method of claim 10, further comprising a plurality of dielectric layers coupled to one or more of the first metal layer, the second metal layer, or the capacitor layer.

14. The method of claim 10, further comprising embedding the balun and one or more other baluns in a multilayer organic substrate.

* * * * *